(12) United States Patent
Hotz et al.

(10) Patent No.: US 8,330,453 B2
(45) Date of Patent: Dec. 11, 2012

(54) CURRENT DETECTION APPARATUS

(75) Inventors: Kai Hotz, Pforzheim (DE); Rainer Dudzik, Oberreichenbach (DE)

(73) Assignee: Seuffer GmbH and Co. KG, Calw (DE)

( * ) Notice: Subject to any disclaimer, the term of this patent is extended or adjusted under 35 U.S.C. 154(b) by 686 days.

(21) Appl. No.: 12/583,661

(22) Filed: Aug. 24, 2009

(65) Prior Publication Data

US 2010/0045286 A1 Feb. 25, 2010

(30) Foreign Application Priority Data

Aug. 25, 2008 (DE) .......................... 10 2008 039 568

(51) Int. Cl.
*G01R 33/06* (2006.01)
*G01R 33/07* (2006.01)
(52) U.S. Cl. ................. 324/207.2; 324/117 H; 324/251; 324/173
(58) Field of Classification Search ................ 324/207.2, 324/251, 173, 117 H
See application file for complete search history.

(56) References Cited

U.S. PATENT DOCUMENTS

| | | | |
|---|---|---|---|
| 6,512,359 B1 * | 1/2003 | Tamai et al. | 324/117 R |
| 7,250,749 B2 * | 7/2007 | Itoh | 324/117 H |
| 7,545,136 B2 * | 6/2009 | Racz et al. | 324/117 H |

FOREIGN PATENT DOCUMENTS

| | | |
|---|---|---|
| DE | 19741417 | 4/1999 |
| DE | 10051 160 | 5/2002 |
| DE | 10243645 | 6/2004 |

OTHER PUBLICATIONS

German Patent Office; Bernhard Neumayer; "Office Action"; whole document (German language only); Oct. 10, 2010. 102008039568.4-35.

* cited by examiner

*Primary Examiner* — Reena Aurora
(74) *Attorney, Agent, or Firm* — Ware, Fressola, Van Der Sluys & Adolphson LLP

(57) ABSTRACT

The invention concerns a current detection apparatus for detection of a current flowing through a conductor (1) by detection of a magnetic field surrounding the conductor. The current detection apparatus includes at least one sensor element (3) provided on a carrier portion (4) for detection of the magnetic field, and a predetermined region (S) of the conductor (1), at which the at least one sensor element is arranged. The conductor (1) in the predetermined region (S) has a plurality of conductor portions (11, 12; La, Lb) which have the current to be measured flowing therethrough in the same direction and which are spaced from each other by a predetermined spacing and which form an intermediate space (2). The carrier portion (4) is fitted into the intermediate space in such a way that the at least one sensor element (3) is arranged outside the intermediate space in adjacent relationship therewith in the magnetic field of the conductor (1).

19 Claims, 6 Drawing Sheets

Schnitt X-X

CURRENT DETECTION APPARATUS

CROSS REFERENCE TO RELATED APPLICATION

Reference is made to and priority claimed from German patent application Ser. No. DE 10 2008 039 568.4, filed Aug. 25, 2008.

BACKGROUND OF THE INVENTION

1. Technical Field

The present invention concerns a current detection apparatus and in particular a current detection apparatus for detection of a current flowing in a conductor by detection of the magnetic field surrounding the conductor.

2. Discussion of Related Art

Detection of a current flowing in a conductor can be effected in known manner by means of suitable measuring devices, wherein what is referred to as a shunt is used and the voltage at that shunt resistor as a consequence of the current is used as a measurement of the current, with a known resistance value. Such a current measurement procedure however suffers from the disadvantage that an additional highly accurate resistor must be incorporated into the circuit of the current to be measured, for a suitable level of accuracy, so that the conduction resistance overall is increased. A measuring device connected to that resistor for the detection of the applied voltage is moreover at the potential of the line, the current of which is to be measured, so that it is not possible in that way to implement a potential-free measuring operation. Furthermore contact resistances occur at the contact locations of the shunt, and those contact resistances make it necessary to perform particular measures to avoid falsification of the measurement result.

An improvement in current measurement can be achieved by carrying out contact-less and potential-free measurement by means of sensors which are sensitive to a magnetic field, for example Hall sensors. In accordance with the Hall effect, a current occurs after the application of a voltage in an electric conductor if it is in a magnetic field. The current represents a measurement in respect of the strength of the magnetic field so that it is possible by means of the Hall sensors to measure magnetic fields directly and currents related to the magnetic field indirectly.

DE 102 43 645 A1 discloses a galvanically separated and thus potential-free current measurement procedure, wherein a main conductor is divided into substantially parallel conductor branches and one or more Hall sensors is or are disposed in the proximity of the conductor branches. The Hall sensors are exposed to the magnetic field caused by the currents in the conductor branches and after evaluation of the output signals of the Hall sensors it is possible to determine the current flowing in the conductor branches and thus also in the main conductor. The Hall sensor (magnetic field-sensitive sensor) is thus arranged in the far field outside the conductor branches above or below the parallel conductors.

In addition DE 197 41 417 discloses a current measuring device with Hall sensors, wherein, in a compact arrangement for a plurality of phases of a power supply system the respective, substantially strip-shaped conductors of each phase are bent in a U-shape at a predetermined location and are arranged in that region in a common housing. Hall sensors for each of the phases are arranged on a separate board in such a way that when the board is fitted on to the housing with the conductors of the respective phases the region of the Hall elements is inserted into the region of the U-shaped loop of the respective conductors. The Hall sensors can thus detect the magnetic field surrounding the respective conductor and therewith the current flowing in the respective conductor, after suitable evaluation.

In both cases however there is no guarantee of a simple and precise arrangement in respect of the Hall sensors in the region of the conductors through which current is flowing, so that on the one hand a relatively high level of complication and expenditure has to be involved in regard to arranging the Hall sensors and on the other hand measurement inaccuracies can scarcely be avoided, in particular when dealing with small currents to be measured, due to positional tolerances of the sensors.

Therefore the present invention is based on the problem of designing a current detection apparatus in such a way that at least one magnetic field-sensitive sensor can be easily arranged on a current-carrying conductor in a suitable region of the magnetic field.

DISCLOSURE OF INVENTION

According to the invention that problem is solved by a current detection apparatus having the features recited in the accompanying claims.

The current detection apparatus according to the invention for the detection of a current flowing through a conductor by detection of a magnetic field surrounding the conductor, includes at least one sensor element provided on a carrier portion for detection of the magnetic field, and a predetermined region of the conductor, at which the at least one sensor element is arranged, wherein the conductor in the predetermined region has a plurality of conductor portions which have the current to be measured flowing therethrough in the same direction and which are spaced from each other by a predetermined spacing and which form an intermediate space, and the carrier portion is fitted into the intermediate space in such a way that the at least one sensor element is arranged outside the intermediate space in adjacent relationship therewith in the magnetic field of the conductor.

In accordance with the present invention therefore the conductor, the current in which is to be detected, is divided into at least two portions of the overall conductor cross-section so that the total current of the conductor is divided to the two conductor portions. Suitable sensor elements (that is to say at least one sensor element) are fitted between two predetermined conductor portions, the sensor elements having a common carrier portion for simplified handling and for precise positioning. By virtue of that arrangement, the sensor elements can be disposed very close to the conductor and in particular to the individual conductor portions so that the magnetic field generated directly around the conductor portions by the current to be measured passes through the sensor elements and the current flowing in the conductor can be inferred from the strength of the magnetic field by virtue of the above-specified Hall effect by means of the sensor elements. In that way the magnetic field surrounding the conductor or conductor portions through which current flows is precisely detected, the sensor elements being arranged in a region of a strong magnetic field and very close to the conductor portions so that this arrangement provides for improved accuracy and the possibility of measuring small currents. The sensitivity of the overall arrangement can be improved with the measurement of small currents.

Further configurations of the present invention are recited in the accompanying appendant claims.

A plurality of mutually spaced sensor elements can be arranged on the carrier portion, wherein in the inserted position of the carrier portion in the intermediate space at least one respective sensor element is arranged with respect to the intermediate space on different sides of the multi-part conductor. In that way it is possible to increase the strength of the output signal (measurement signal) from the arrangement, whereby an increase in accuracy is achieved.

To avoid an increase in the resistance of the conductor portions, the plurality of conductor portions can have a cross-sectional area corresponding to that of the conductor, wherein the sum of currents in the conductor portions is equal to the current to be detected.

In addition the plurality of conductor portions in the predetermined region can have two U-shaped formations having three substantially parallel conductor portion parts with a central common conductor portion part by which at least two field regions are formed between the conductor portion parts, the open sides of which are respectively oriented in opposite directions along a longitudinal extent of the conductor. In that way it is possible to form regions with an increased-strength magnetic field.

The intermediate portion can extend over all conductor portion parts of the plurality of conductor portions within the predetermined region and in particular the intermediate space can extend over all conductor portion parts of the plurality of conductor portions with the predetermined height uniformly within the predetermined region.

The carrier portion can be arranged in the intermediate space in such a way that the at least one sensor element is arranged in one of the field regions between the conductor portion parts. The field regions between the conductor portion parts have a stronger magnetic field, in which case a magnetic field present in the respective field regions is formed by the currents in the portion parts respectively adjacent to the field regions in question.

The carrier portion can be fitted into the intermediate space in such a way that at least one sensor element is arranged in each of the field regions between the conductor portion parts. The carrier portion can at least partially fill the predetermined intermediate space in the predetermined region.

The cross-sectional area of the conductor portion parts can be substantially equal so that approximately equal currents flow in the conductor portion parts.

The plurality of sensor elements can be arranged on the carrier portion at predetermined locations and the carrier portion can be fitted into the intermediate space in such a way that a longitudinal edge of the carrier portion forms a predetermined angle with a longitudinal direction of the conductor and at least one sensor element is arranged in each field region.

In addition the plurality of conductor portions can be formed by individual conductors, wherein the totality of the individual conductors forms the conductor.

It is possible to provide at least two sensor elements, and after insertion of the carrier portion into the intermediate space at least one sensor element can be arranged in each of the field regions.

Furthermore the plurality of sensor elements can be arranged on a common substrate.

The plurality of conductor portions can be formed by individual conductors fitted into a common holding element and wherein the intermediate space at least partially extends into the holding element.

The conductor in the predetermined region can be enclosed by a housing and the interior of the housing can be filled with an insulating material.

BRIEF DESCRIPTION OF THE DRAWINGS

The present invention is described in greater detail hereinafter by means of embodiments by way of example with reference to the Figures in which:

FIG. 6a shows a sectional view of a conductor arrangement comprising two individual conductors in accordance with a fourth embodiment of the present invention and FIG. 6b shows a plan view of the conductor arrangement comprising two individual conductors as shown in FIG. 6a.

DETAILED DESCRIPTION

A conductor arrangement of the current detection apparatus according to the invention, in a first embodiment thereof, is described in detail hereinafter.

Figure 1A:
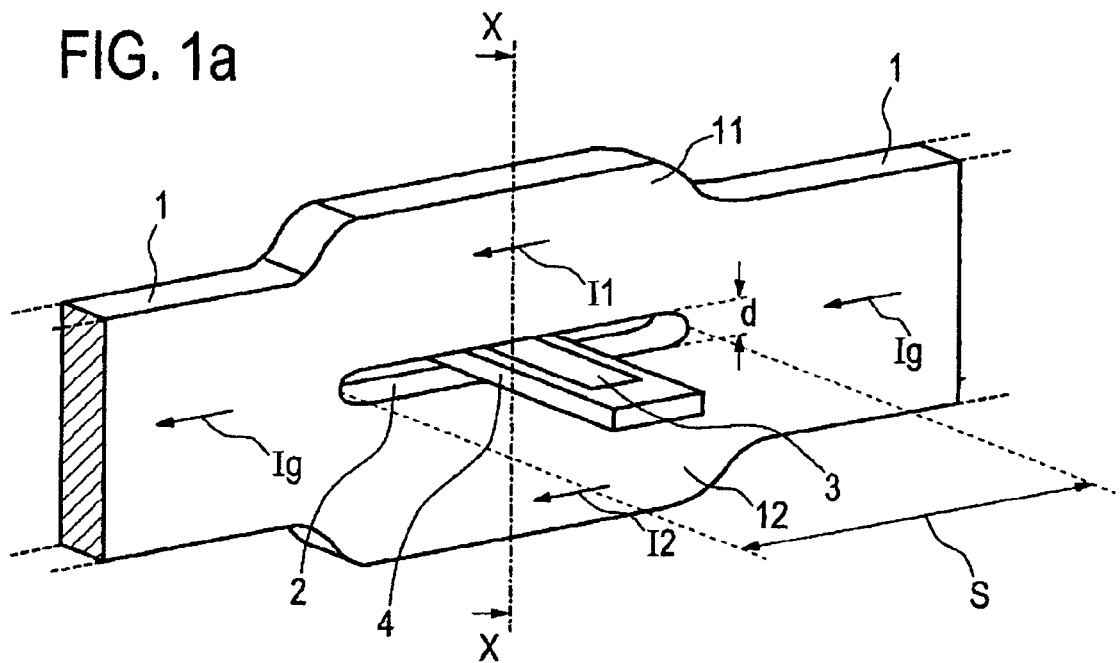
FIG. 1a shows a perspective view of a part of a conductor arrangement with associated sensor elements in accordance with a first embodiment of the present invention and FIG. 1b shows the sectional view of that conductor arrangement along a section line A-A.

In detail FIG. 1a shows a conductor 1 in which a current Ig flows from right to left in the Figure. The current Ig is the current to be detected and represents the total current in the conductor arrangement.

In a predetermined region (predetermined section) S of the conductor 1 the conductor 1 is of a multi-part configuration and in the present case for example is of a two-part configuration so that this forms a first conductor portion 11 and a second conductor portion 12 which are guided in substantially mutually parallel relationship and moreover substantially together involve the same cross-section as the conductor 1. In the predetermined region S of the multi-part configuration of the conductor 1 the first conductor portion 11 and the second conductor portion 12 are mutually spaced by a predetermined spacing d. Therefore, in the predetermined region S of a multi-part configuration the external profile of the conductor 1 consisting of the two conductor portions 11 and 12 is enlarged so that the same cross-sectional area (current through-flow area) for the conductor 1 can be maintained.

The spacing d between the first and second conductor portions 11 and 12 thus forms a gap or intermediate space 2 which preferably extends in the longitudinal direction of the conductor 1 and which is of a uniform spacing or height d.

The first and second conductor portions 11 and 12 respectively carry current portions of the total flow Ig of the conductor 1. As the cross-sectional area in both conductor portions 11 and 12, through which current flows, is approximately equal, the overall current Ig is divided into two approximately equal current portions 11 and 12. The present invention however is not restricted to that preferred embodiment and the cross-sectional areas (current through-flow areas) of the two conductor portions 11 and 12 can also be different in a predetermined fashion so that this also leads to a differing current distribution. The mode of operation of the arrangement according to the invention is not influenced thereby. In any event the sum of the cross-sectional areas of the conductor portions 11 and 12 is preferably approximately equal to the cross-sectional area of the conductor 1.

Figure 1B:
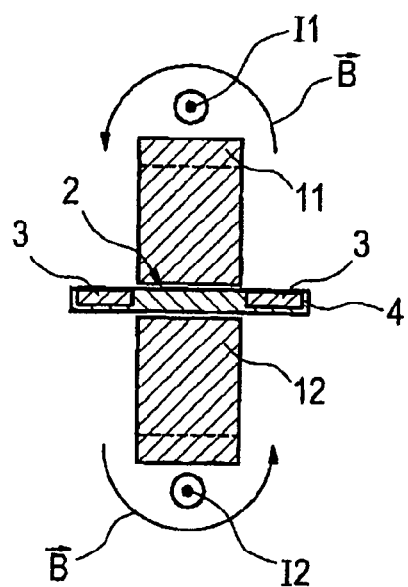

In the view in FIG. 1*b* showing a cross-section taken along section line X-X the first current portion I1 flows in the first conductor portion 11 and the second current portion I2 flows in the second conductor portion 12 in the same directions and out of the plane of the paper in the FIG. 1*b* view.

The magnetic field caused by each of the currents is indicated by the part of a field line of the induction B (vector) in FIG. 1*b*.

To detect the magnetic field of the two conductor portions 11 and 12 having current flowing therethrough in the same direction the arrangement has magnetic field-sensitive sensors, for example Hall sensors, which are referred to hereinafter as sensor elements 3. FIG. 1*b* shows two sensor elements 3, with preferably at least one respective sensor element 3 being arranged on each side of the conductor arrangement with the first and second conductor portions 11 and 12. In principle however there is also the possibility of effecting magnetic field detection and determination of the current flowing in the conductor 1, only by means of one sensor element 3 on one side.

The magnetic field B produced by the respective current portions I1 and I2 of the first and second conductor portions 11 and 12 passes through the sensor elements 3 of which there are two in the present embodiment so that an output signal can be taken from the sensor elements 3 in dependence on that magnetic field. After suitable evaluation of the sensor signals the overall current Ig consisting of the current portions I1 and I2 can be determined.

The at least one sensor element 3 or the plurality of sensor elements 3 are arranged on a carrier portion 4. The carrier portion 4 serves on the one hand for carrying and handling of the sensor elements 3 and on the other hand for exact positioning of the sensor elements 3 in the immediate proximity of the conductor portions 11 and 12. In this case preferably the carrier portion 4 on or in which the sensor elements 3 are arranged at predetermined locations is inserted or pushed into the intermediate space 2 (gap) between the first and second conductor portions 11 and 12. The intermediate space 2 of the spacing (height) d between the conductor portions 11 and 12 is preferably only slightly greater than the thickness of the carrier portion 4 in the direction of the axis X-X.

In that way the carrier portion 4 with the preferably plurality of sensor elements 3 can be fitted into the intermediate space 2 between the two conductor portions 11 and 12 in such a way that a secure fit for the carrier portion 4 is guaranteed and the sensor elements 3 arranged on the carrier portion 4 are disposed in directly adjoining relationship with the respective conductor portions 11 and 12 but outside the intermediate space between the conductor portions 11 and 12.

In accordance with the field configuration to be expected in respect of magnetic induction B (vector) of the current portions 11 and 12 in the conductor portions 11 and 12, the sensor elements 3 are arranged in a strong region of the magnetic field so that, even with a small overall current Ig in the conductor 1, this ensures adequate and reliable detection of that current by the high measuring sensitivity of the arrangement. The overall conductor cross-section of the conductor 1 which as in the present embodiment can preferably be in the form of a rail thus provides for the formation of two preferably but not necessarily equal-sized conductor portions so that on the one hand this provides for division of the overall current Ig, while on the other hand the carrier portion 4 with at least one sensor element 3 and preferably at least two sensor elements 3 can be securely inserted between the conductor portions 11 and 12 spaced at the spacing d in an intermediate space 2, wherein at the same time this ensures precise and optimised positioning of the sensor elements 3 in the overall magnetic field of the current portions I1 and I2.

For the sake of better handling of the sensor elements 3 they can be arranged jointly on a chip or substrate which in turn can be arranged in the carrier portion 4, in which case further electronic components and circuitry parts, by means of which at least preliminary processing of the output signals of the sensor elements 3 can be effected, can also be arranged on such a common chip or substrate, besides the sensor elements 3. In that case the sensor elements and the further electronic components and circuitry parts are arranged in integrated form on the substrate. The plurality of the sensor elements 3 and the further electronic components and circuitry parts can be formed in that case on the common substrate by means of a common manufacturing procedure. The carrier portion 4 can be fitted into the intermediate space 2 in such a way that for example a longitudinal edge of the carrier portion forms a predetermined angle with a direction of the longitudinal extent of the conductor 1.

With a multiplicity of sensor elements 3, each of the sensor elements 3 can also be arranged on a dedicated chip or substrate with a dedicated associated electronic evaluation means, in which case the semiconductor chips are connected together in the carrier portion 4 in accordance with the requirements involved. The carrier portion 4 also includes appropriate connecting lines for delivery of the detection signals from the sensor elements 3 or for the delivery of signals which have already been subjected to preliminary processing to a further (generally central) evaluation or control device. The connecting lines are not shown in the Figures to simplify the views therein.

The arrangement of the at least one sensor element 3 or a plurality of sensor elements 3 in the above-described manner by means of the carrier portion 4 results in a sensor arrangement in which the sensors are insulated in relation to the potential of the conductor 1 into which the carrier portion 4 is fitted. Additional insulating measures are not required as an at most actually negligible potential difference occurs in the region of the intermediate space 2 between the conductor portions 11 and 12. There is moreover no galvanic connection relative to the conductor 1 so as to ensure on the one hand potential-free and on the other hand contact-less detection of the current Ig flowing in the conductor 1.

The conductor arrangement of the conductor 1 with the first and second conductor portions 11 and 12 spaced by way of the intermediate space 2 (spacing or height d), as already stated hereinbefore, is optimised in terms of current-carrying capability by substantially retaining the required conduction cross-section (current through-flow area). By virtue of that optimisation, there is no increased resistance at the location of the arrangement of the sensor elements 3, that is to say in the predetermined region S of the multi-part arrangement of the conductor 1, so that an increased generation of heat does not occur at that location and thus a heat pole is avoided in that region.

In addition further circuitry parts arranged on a common chip or substrate are disposed on the substrate in a region between the sensor elements 3 and thus in a weak-field region as respective sub-fields of the currents I1 and I2 flowing in the conductor portions 11 and 12 at least in part cancel each other out in the intermediate space between the conductor portions 11 and 12, as a consequence of different field directions.

In FIG. 1a the carrier portion 4 for receiving the sensor elements 3 does not occupy the entire space formed by the intermediate space 2. The carrier portion 4 can however also extend over the entire intermediate space 2 in the predetermined region S.

Figure 2A:
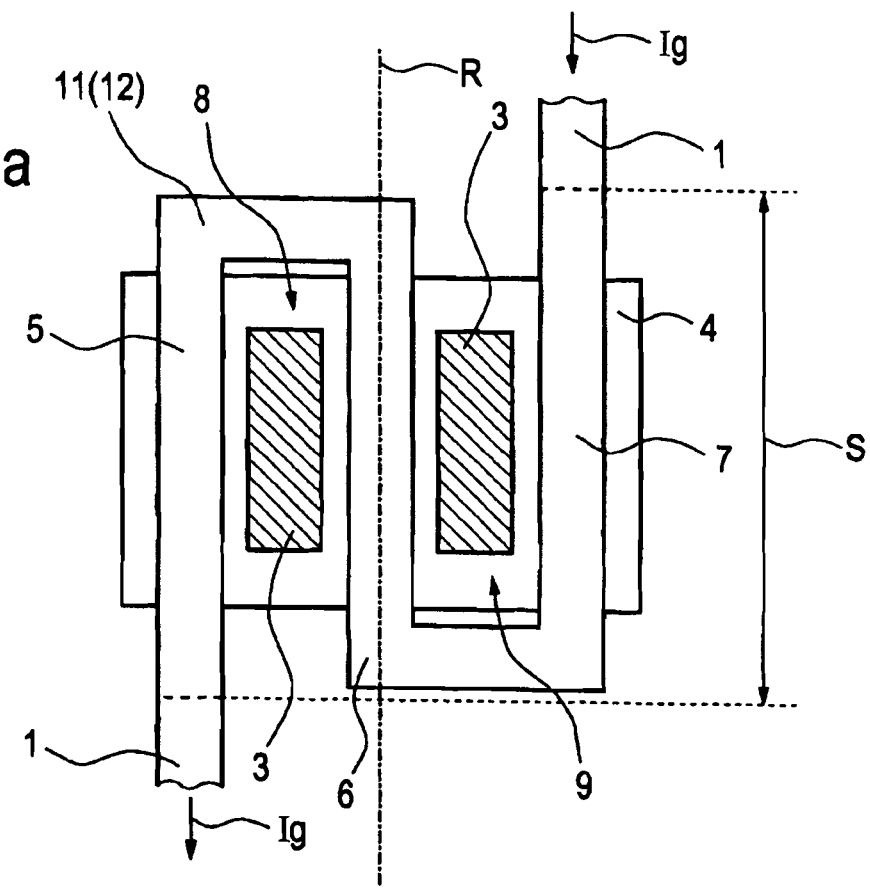
FIG. 2a shows a diagrammatic plan view of a conductor arrangement with associated sensor elements in accordance with a second embodiment of the present invention and FIG. 2b shows a partly sectional front view of the conductor arrangement of FIG. 2a, FIG. 3 shows a perspective view of a conductor arrangement in accordance with a third embodiment of the present invention.

It is to be noted in this connection that the view in FIGS. 1 and 2 is only diagrammatic and that the present invention is not limited to the illustrated dimensions and proportions. Rather the length of the intermediate space 2 (in the direction in which the conductor 1 extends, as indicated by the broken line R in FIG. 2a) in the predetermined region S and thus the region of the multi-part configuration of the conductor 1 is determined in dependence on the dimensions of the carrier portion 4 and the positioning of the respective sensor elements 3 directly in the strong field adjacent to the conductor portions 11 and 12.

Figure 2B:
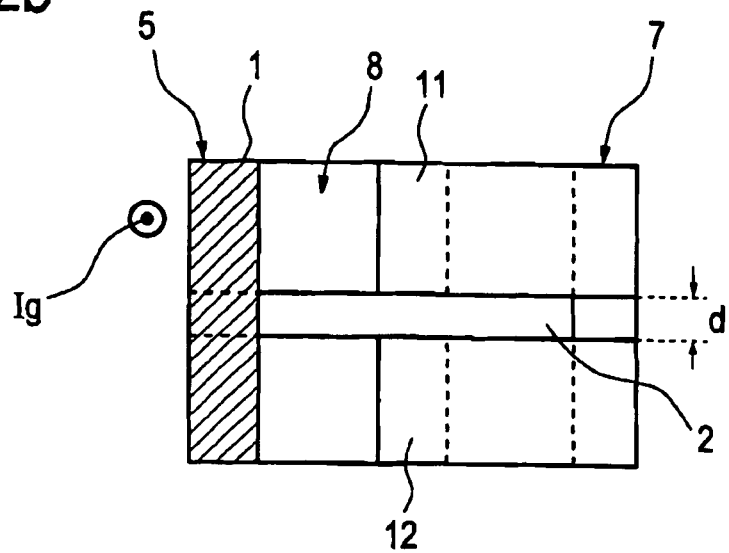

With reference to FIGS. 2a and 2b, the current detection apparatus according to a second embodiment of the present invention will now be described hereinafter.

In the view in FIG. 2a showing a plan view of the conductor arrangement, the basic arrangement involved is also a conductor in bar form, of a cross-sectional area (current through-flow area) that is rectangular for the sake of simplification of the drawing.

The same references are used in FIGS. 2a and 2b for the same or similar components of the current detection apparatus, as those employed in FIGS. 1a and 1b.

FIG. 2b shows a front view of the conductor arrangement of the current detection apparatus, with the conductor 1 with a rectangular cross-sectional area (current through-flow area) being shown on the left-hand side in FIG. 2b, in the partial section.

As shown in FIG. 2a the conductor 1 which is in bar form in the present embodiment is bent a plurality of times so that two U-shaped conductor portion parts with a common conductor section are formed and the open sides thereof are respectively oriented in opposite directions along a longitudinal extent of the conductor (broken line R in FIG. 2a). FIG. 2a shows essentially the region of the loop formed by the double-bend configuration or corresponding production of the conductor 1, wherein that section of the conductor 1 is referred to as a predetermined region S and corresponds to the predetermined region S in the first embodiment (FIG. 1). The (for example bar-shaped) conductor 1 can also be suitably produced in manufacture with the two U-shaped configurations, besides the possible option of mechanically bending it. This is shown in FIGS. 2a and 2b. The conductor arrangement in FIG. 2a is thus preferably point-symmetrical with respect to a point on the broken line R in FIG. 2a and the centre of the predetermined region S.

In the same fashion as shown in FIG. 1a, the conductor 1 in the predetermined region S includes a multi-part arrangement which in the present case is preferably a two-part arrangement, with an intermediate space 2 (gap) being formed as shown in FIG. 2b. The intermediate space 2 extends through the entire conductor 1 within the region S and thus the first conductor portion 11 is formed in the upper part of FIG. 2b and the second conductor portion 12 is formed in the lower part of FIG. 2b, with the intermediate space 2 arranged therebetween. The intermediate space 2 is arranged within the region S of the loop of the conductor 1 in such a way that the opening of the intermediate space 2 extends in terms of width and height d through all conductor portions of the two U-shaped formations. That is shown in FIG. 2b.

Thus the double U-shaped formation which is of a two-part nature in the predetermined region S respectively provides in the plan view of FIG. 2a a first conductor portion part 5 on the left-hand side of that Figure, a second conductor portion part 6 in the centre of the Figure and a third conductor portion part 7 on the right-hand side of the Figure, formed from the first conductor portion 11 of the conductor 1. First, second and third conductor portion parts 5 to 7 are also formed in a similar fashion by the arrangement of the second conductor portion 12, wherein the respective first, second and third conductor portion parts 5 to 7 of the respective first and second conductor portions 11 and 12 are aligned with each other in the plan view in FIG. 2a as they are similarly of a double U-shaped configuration.

The overall conductor 1 in the predetermined region S thus consists of the two conductor portions 11 and 12 which are similarly of a double U-shaped configuration and the conductor portions 11 and 12 respectively comprise the conductor portion parts 5 to 7.

The current detection apparatus in the second embodiment of the present invention further includes in the same manner as the first embodiment a carrier portion 4 which in the plan view in FIG. 2a is shown as being substantially rectangular for the sake of simplicity of the drawing, without the present invention being restricted thereto. The carrier portion 4 is of a thickness which is smaller than the spacing d of the intermediate space 2 so that the carrier portion 4 can be pushed into the intermediate space 2 and can thus be arranged in the region of the respective first to third conductor portion parts 5 to 7 of the conductor 1. The carrier portion 4 is not shown in FIG. 2b.

To detect the magnetic current surrounding the respective conductor portions 11 and 12, sensor elements 3 are arranged in the same manner as in the first embodiment, the sensor elements in FIG. 2a being respectively indicated between the first and second conductor portion parts 5 and 6 and the second and third conductor portion parts 6 and 7 of the first conductor portion 11.

The sensor elements 3 are also in the form of magnetic field-sensitive sensors such as for example Hall sensors and detect the magnetic field produced between the respective conductor portion parts 5 to 7 or conductor portions 11 and 12.

In this case the sensor elements can also be disposed on a substrate, that is to say on a chip, and can be in part arranged together with further electronic circuits, depending on the requirements involved, in which case the connecting lines required for further evaluation of the sensor signals extending outwardly to a central control and processing device are not shown for the sake of simplicity of the drawing.

In the conductor arrangement shown in FIG. 2a a first field region 8 is formed between the first and second conductor portion parts 5 and 6 of the respective first and second conductor portions 11 and 12, the magnetic field thereof being detected by the first of the sensor elements 3. Formed between the second and third conductor portion parts 6 and 7 of the conductor portions 11 and 12 is a second field region 9, the magnetic field thereof being detected by the further sensor elements 3. Both sensor elements 3 in FIG. 2a thus respectively detect the overall field in one of the field regions 8 or 9 and in dependence on the detected intensity of the field (magnetic induction B, vector) provide corresponding output signals or detection signals which in addition to possible preliminary processing by means of the circuits arranged on the common substrate, are communicated to the central control and evaluation device (not shown) for further processing.

With the arrangement of the sensor elements 3, in which respect in principle it is also possible for only one sensor element to be provided in one of the field regions 8 or 9, the sensor elements 3 are disposed in the field regions 8 and 9 in a region of a stronger magnetic field (with greater induction B) as, in dependence on the current configuration occurring in the respective conductor portion parts 5 to 7 and in particular in dependence on the direction of the current, a field amplification effect occurs in the field regions 8 and 9. In the view shown in FIG. 2 the current path is directed downwardly in the first and third conductor portion parts 5 and 7 while it is directed upwardly in the second conductor portion part 6 of the respective first and second conductor portions 11 and 12. Amplification of the magnetic field is achieved in the field regions 8 and 9 in that way, the direction of the magnetic field (magnetic induction B, vector) being different in the field regions 8 and 9. In each of the field regions 8 and 9, the fields of the currents in the respective conductor portion parts 5 to 7 are superimposed in the same sense in respect of their direction so that the sensor elements in the respective field regions 8 and 9 are capable of detecting even relatively weak magnetic fields and thus small currents, as a consequence of the amplified field in those regions.

The arrangement of at least one sensor element and in particular in accordance with the present embodiment two sensor elements 3 or sensor elements arranged in paired relationship in the field regions 8 and 9 with the amplified (superimposed) magnetic field leads to a considerable rise in the sensitivity of the overall arrangement in regard to current detection so that even small currents can be reliably detected. With suitable evaluation of the output or detection signals of the sensor elements 3, having regard to the respective sign of the sensor elements 3 in the respective field regions 8 and 9, it is also possible to ascertain the current direction.

The overall arrangement shown in FIGS. 2*a* and 2*b* is thus optimised in terms of an improvement in sensitivity and improved utilisation of the magnetic field. In terms of the current-carrying capability of the individual conductor portions 11 and 12 for the avoidance of an increased resistance and a heat pole related thereto in the predetermined region S of the loop (U-shaped configuration) of the conductor 1, optimisation can also be effected in the same manner as in the first embodiment (FIG. 1*a*) so that an approximately equal current density is respectively achieved essentially for the conductor portion parts 5 to 7 of the individual conductor portions 11 and 12.

The circuits further arranged on a possible common substrate of the sensor elements 3 can be arranged in the same manner as in the first embodiment in the region of the conductor portion parts 5 to 7 of the conductor portions so that there they are exposed to a negligible potential and are in a weak-field region. In that way there is no need for further insulation measures in relation to voltages or screening in relation to magnetic fields.

Processing of the output signals from the sensors 3 in the respective field regions 8 and 9 can be effected by means of a differential method, wherein the useful components of the overall output signal involved can be increased by the different field directions, while interference phenomena acting in a similar manner on the overall arrangement from the outside can be reduced or completely eliminated. That measure also serves to enhance the sensitivity of the current detection apparatus according to the present invention so that even relatively small currents can be reliably and accurately measured.

The conductor arrangement as shown in FIGS. 2*a* and 2*b* can be used in relation to any kind of current bar if there is the possibility of designing the current bar (that is to say the generally bar-shaped conductor) with the two U-shaped line configurations. The intermediate space 2 which is aligned in all conductor portions is also to be provided.

The current detection apparatus according to the invention can thus be used in power supply installations and for example also in a motor vehicle. When used in a motor vehicle the currents from and to a normal motor vehicle battery and also a high-power battery which is required in a hybrid vehicle for operation thereof can be detected. The enhanced sensitivity of the current detection apparatus according to the invention makes it possible to detect even very small currents, with the current direction being identified. In that way it is possible, in conjunction with further properties of the battery such as the terminal voltage, temperature and an initial state of charge to continuously detect the general state of charge (SOC) of the battery, as the basis for effective operation of a general motor vehicle or a hybrid vehicle.

Figure 3:
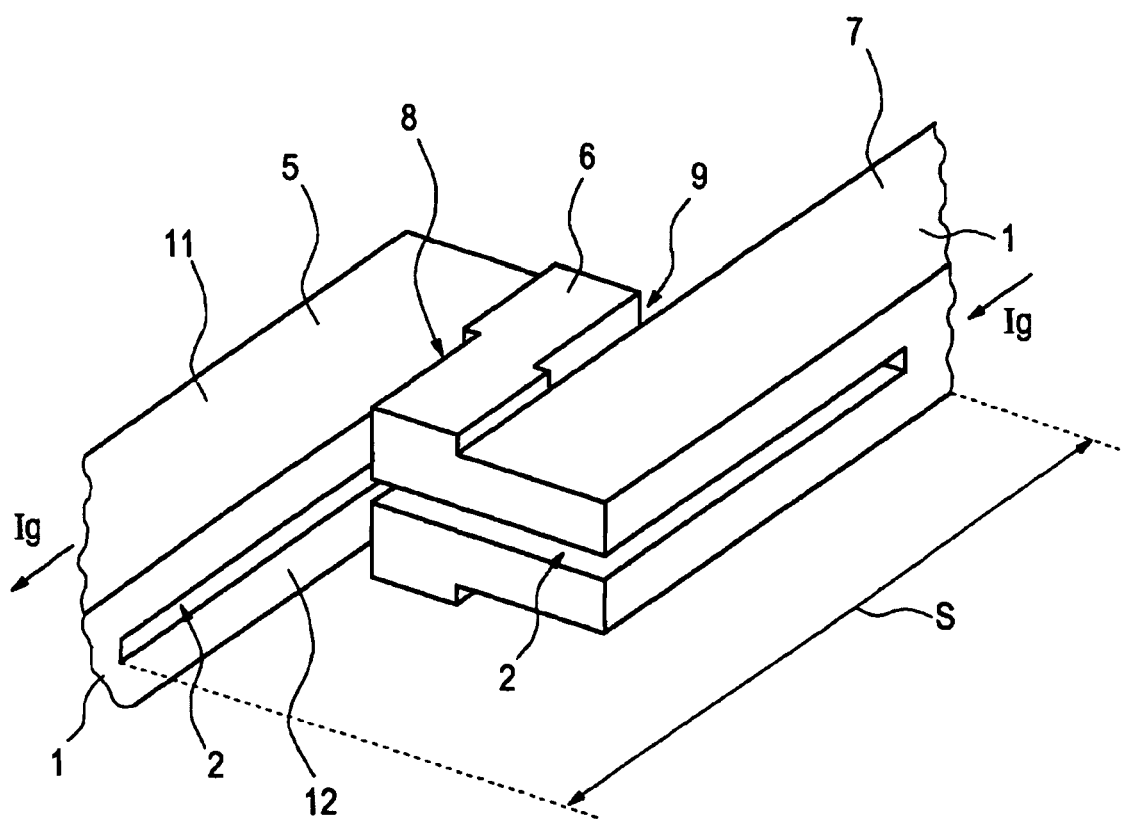
Figure 4:
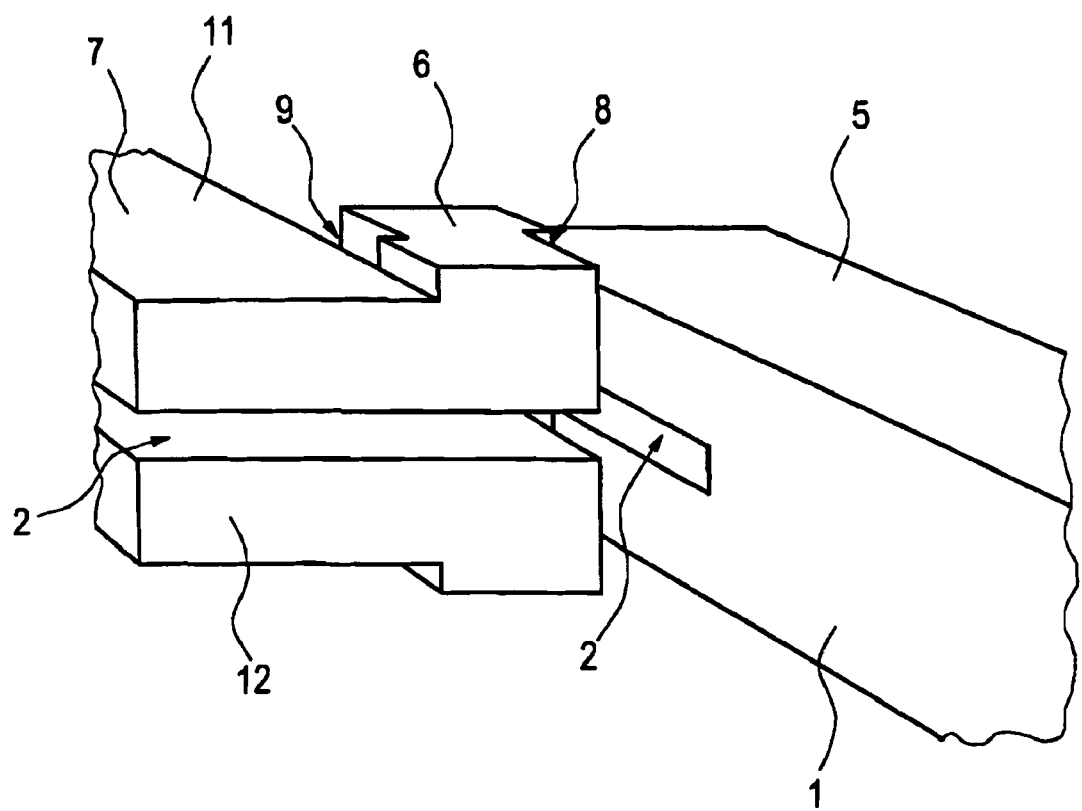
FIG. 4 shows a perspective view of the conductor arrangement of FIG. 3 viewed from the opposite side.
Figure 5:
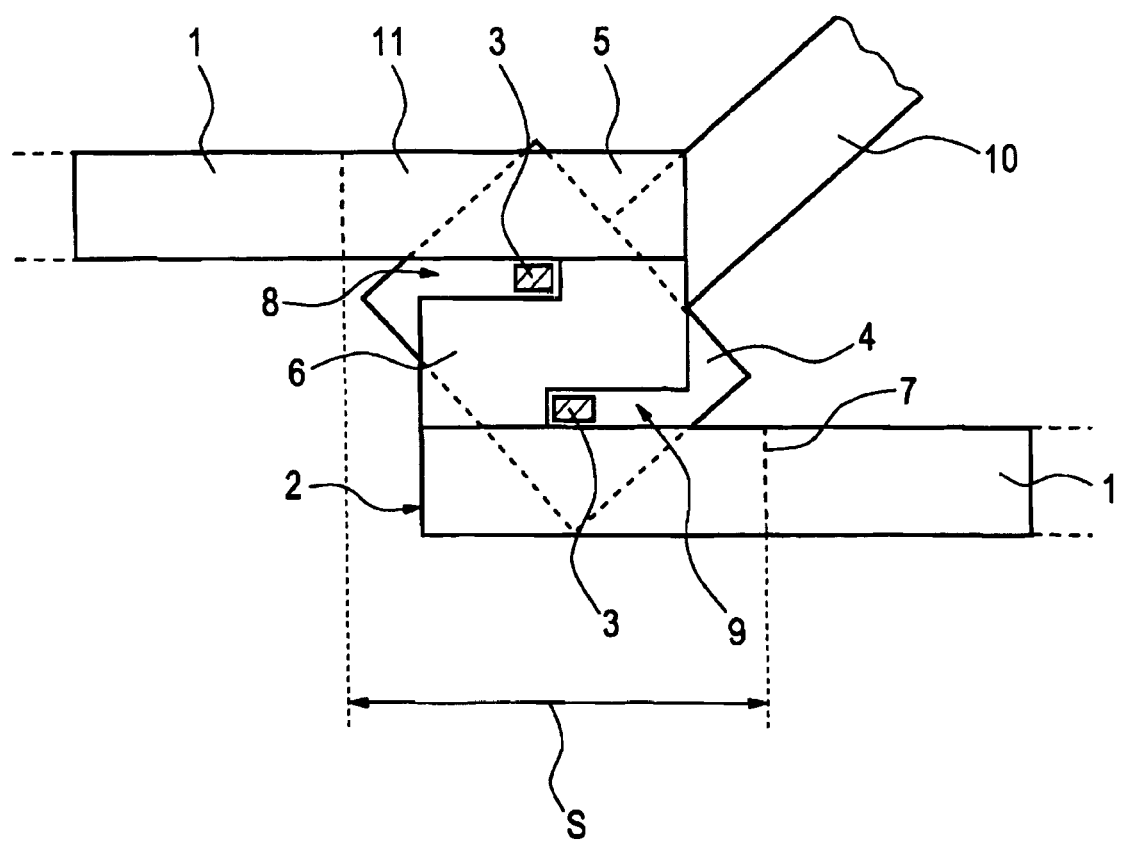
FIG. 5 shows a plan view of the conductor arrangement of FIGS. 3 and 4 with an inserted carrier portion and sensors.

Referring to FIGS. 3 to 5 a third embodiment of the present invention will now be described. The same references in FIGS. 3 to 5 denote identical or similar parts to those specified in the other FIGS. 1*a*, 1*b* and 2*a* and 2*b*.

FIGS. 3 to 5 show various illustrations from different angles of view as a perspective view (FIGS. 3 and 4) and a plan view (FIG. 5) of a conductor arrangement of a substantially bar-shaped conductor which is of a multi-part configuration in a predetermined region S. This arrangement corresponds in principle to that shown in FIGS. 2*a* and 2*b* with two substantially U-shaped formations in respect of the conductor portions 11 and 12 and the corresponding formation of two field regions 8 and 9. In this case the field region 8 is between the first and second conductor portion parts 5 and 6 and the field region 9 is between the second and third conductor portion parts 6 and 7. The intermediate space 2 extends in the predetermined region S with an equal height or thickness d through the entire conductor arrangement. In the predetermined region S the conductor 1 is of a multi-part nature and in the present embodiment is of a two-part configuration, wherein the first conductor portion 11 and the second conductor portion 12 are formed with the respective first to third conductor portion parts 5 to 7 which are of a mutually symmetrical configuration in the present third embodiment.

The arrangement in the view in FIG. 3 is optimised in relation to field concentration and field amplification of the magnetic field in the field regions 8 and 9, and also in regard to the current-carrying capability of the overall arrangement, in particular in the second conductor portion part 6 (that is to say the central conductor part portion which is common in relation to the double U-shaped configuration) of the respective first and second conductor portions 11 and 12. The second conductor portion part 6 is enlarged in its cross-sectional area for substantially maintaining the original current density in the first and second conductor portion parts 5 and 7 so that the current-carrying capability is improved and the influence of an increase in resistance is reduced. The formation of a heat pole in the predetermined region S as a consequence of an even slight increase in the resistance of the conductor portions 11 and 12 is avoided.

FIG. 4 also shows a perspective view of the conductor arrangement of FIG. 3, but from the opposite side. It will be seen that the intermediate space 2 extends with a uniform height or thickness d in the entire region S (see FIG. 3). FIG. 4 also shows optimisation of the configuration of the central conductor portion part 6 of the first and second conductor portions 11 and 12 to improve the current-carrying capability.

The views in FIGS. 3 and 4 do not show the sensor elements 3 illustrated in FIGS. 1 and 2, and the carrier portion 4 carrying the sensor elements 3, for the sake of simplicity of the drawing.

FIG. 5 shows a plan view of the conductor arrangement of FIGS. 3 and 4, additionally showing the carrier portion 4 which is fitted into the intermediate space (gap) 2 and by means of which the sensor elements 3 are held and arranged (positioned) in the respective field regions 8 and 9.

While in FIGS. 1a and 2a the carrier portion 4 with the at least one sensor element 3 or the plurality of sensor elements 3 was inserted substantially at a right angle to the longitudinal extent of the conductor (FIG. 1a) or the conductor portion part 5 to 7 (FIG. 2a) of the first and second conductor portions 11 and 12, the carrier portion 4 can also be fitted at any angle into the intermediate space 2, in dependence on the arrangement of the at least one sensor element 3 or a plurality of sensor elements 3 on the carrier portion 4. In that respect it is necessary for the sensor element 3 or the sensor elements 3 to be arranged in the respective field region 8 or 9 associated with those sensor elements for measurement purposes. By way of example the feed lines to the sensor elements 3 and the circuits additionally arranged on the possible common substrate of the sensor elements 3 can be arranged in a part 10 of the carrier portion 4, that extends inclinedly upwardly towards the right in FIG. 5.

With the FIG. 5 arrangement, the additional circuits are on the common substrate of the sensor elements 3 and also arranged in the carrier portion 4 in the region of the first and second conductor portions 11 and 12 and in particular of the second (central) conductor portion part 6 in a region of a weaker magnetic field and also a negligible potential so that there is no need for additional measures for electrical insulation or magnetic screening of the entire arrangement on the common substrate.

In the same manner as in the second embodiment the sensor elements 3 are disposed on the carrier portion 4 in the region of the amplified magnetic field (field regions 8 and 9) so as also to ensure a high level of sensitivity for the current detection apparatus even with small currents.

Referring to FIG. 6 a fourth embodiment of the present invention will now be described. The fourth embodiment is based in its function on the second and third embodiments, but any conductors of preferably circular cross-section can be used.

Figure 6A:
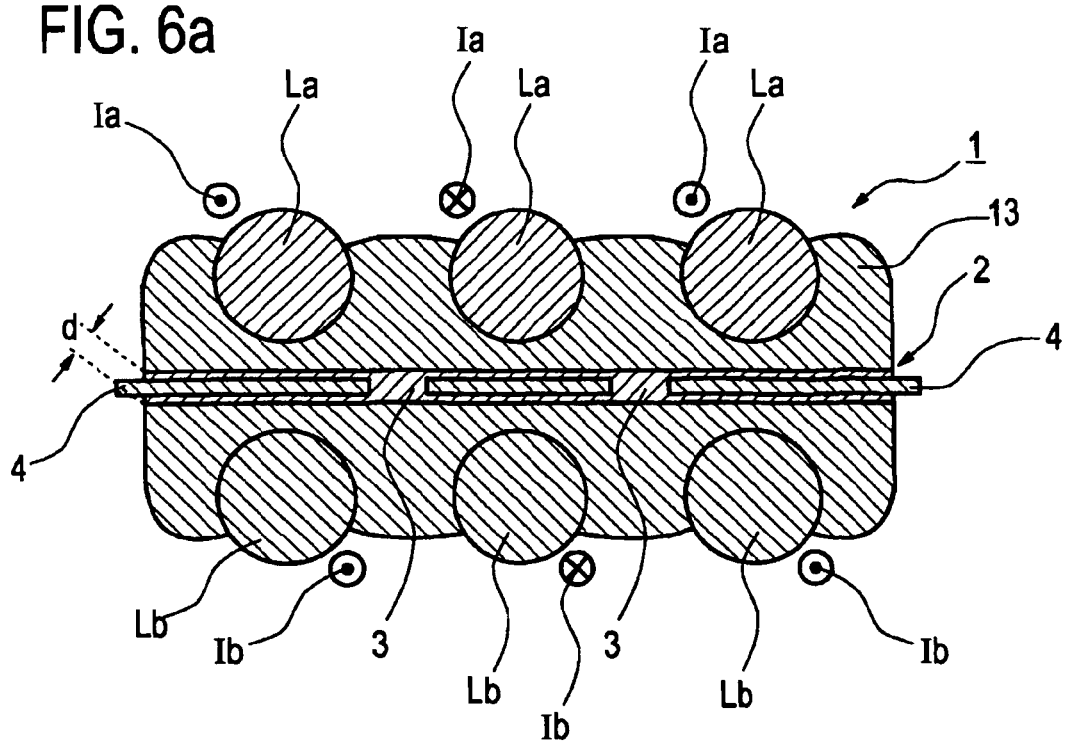
Figure 6B:
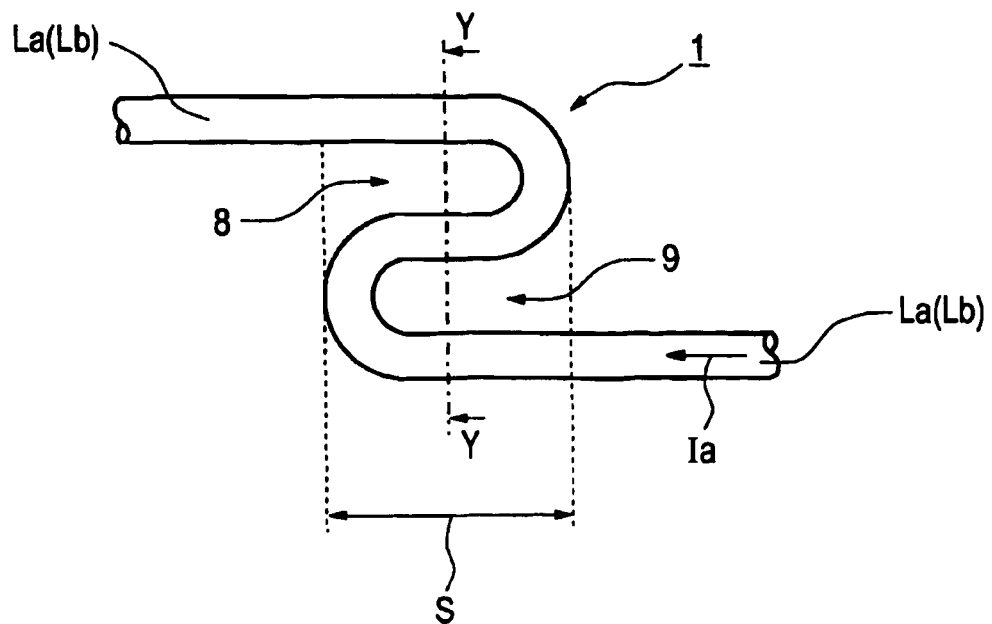

In the illustration in FIG. 6 which is a sectional view, an upper conductor La which is in the form of an individual conductor is bent in the same manner as shown in FIG. 2a to correspond to two U-shaped parts so that the same conductor, that is to say the first conductor La, is sectioned in the sectional view perpendicularly to the longitudinal extent of the conductor. FIG. 6b shows a plan view of an individual conductor in the form of the first conductor La and the associated section line. A second conductor Lb is arranged in the same manner and in alignment with the first conductor La beneath the first conductor La in the plan view of FIG. 6 so that it cannot be seen there, and is of the same configuration in the form of the double U-shaped bent configuration. The first conductor La and the second conductor Lb have current flowing therethrough in the same direction, FIG. 6a showing the direction of a current Ia in the first conductor La and the direction of a current Ib in the second conductor Lb.

The two separate individual conductors La and Lb which together form the conductor (main conductor) 1 are arranged in a common housing 13, by means of which on the one hand they are mechanically held and on the other hand arranged in a corresponding manner in aligned superposed relationship, thereby forming an arrangement corresponding to the multi-part arrangement of the respective conductor 1 in FIGS. 2a and 3 to 5.

The common housing 13 comprises for example an insulating and non-magnetic material so that the two individual conductors La and Lb can be inserted without a dedicated insulation and after the corresponding double U-shaped bend has been formed. Preferably the housing comprises a plastic material and is of a one-piece or multi-part structure. In the region of the double U-shaped loop (corresponding to the predetermined region S in FIG. 2a) the housing 13 further includes an intermediate space (gap) 2 which is comparable to the arrangement in FIG. 2a and in FIGS. 3 and 4 and which is provided continuously under all conductor portions of the conductors La and Lb and which is of a uniform predetermined spacing or height d. As in the previous embodiments, the carrier portion 4 with at least one sensor element 3 and preferably a plurality of sensor elements 3 can be fitted into the intermediate space 2, in which case the sensor elements 3 are respectively arranged within the field regions 8 and 9 (FIG. 6b) of the individual conductors La and Lb, in accordance with their arrangement on the carrier portion 4 and the position of the carrier portion 4 in the intermediate space 2.

An amplified magnetic field occurs in the field regions 8 and 9 of the individual conductors La and Lb, with the currents flowing in the individual conductors La and Lb, so that that magnetic field can be detected by means of the at least one sensor element 3 or the plurality of sensor elements 3. In this case also the plurality of sensor elements 3 can be provided on a common substrate in the form of a common chip, in which case once again additional electronic circuits serving for preliminary evaluation can be arranged beneath the individual conductors La and Lb, with a weaker magnetic field. Connections to a central processing and control device are not shown in the Figures for the sake of simplicity.

The arrangement of the current detection apparatus according to the invention in the fourth embodiment thus affords the possibility of implementing current measurement on the basis of the measurement principle described in the second and third embodiments, wherein an overall current is divided into two current portions Ia and Ib of the respective individual conductors La and Lb and wherein the individual conductors La and Lb can be fitted in a suitably pre-bent configuration into the common housing 13 for forming the preferred conductor arrangement (that is to say the conductor 1). When the carrier portion 4 with the associated sensor elements 3 is fitted into the intermediate space 2 of the housing 13 that then provides the arrangement of current conductors and sensor elements, that is in accordance with the illustrated measurement principle. It is possible in that way to also provide for advantageous current measurement in accordance with the present invention, when dealing with individual conductors.

The fourth embodiment has the same advantages as the second and third embodiments, in which respect in particular the sensitivity can be increased by the arrangement of the at least one sensor element 3 or the plurality of sensor elements 3 in a region of a stronger magnetic field so that even very small currents in the conductor arrangement can be reliably and accurately measured.

FIG. 6a thus shows a sectional view along section line Y-Y in FIG. 6b, wherein even relatively thin current bars can be bent in a similar manner if there are two parallel current bars through which the current flows in the same direction.

In the fourth embodiment and in the FIG. 6a view, a non-magnetic material (the material of the common housing 13) is disposed in the two partially open internal spaces of the field regions 8 and 9 while there may also be no material in the corresponding field region in the previous embodiments as illustrated in the Figures.

What is common to all embodiments is the possibility of providing a housing around the conductor arrangement and in particular or at least around the predetermined region S of the multi-part configuration of the conductor 1 in question, which housing surrounds the entire conductor arrangement and which can be internally filled by casting with an electrically insulating and non-magnetic material after the carrier portion 4 with the associated sensor elements 3 has been fitted and connected. In that case the casting and thus complete closure of the conductor arrangement makes it possible to prevent the ingress of dirt and unwanted foreign bodies even upon operation in a polluted environment.

If an outer housing (not shown in the Figures) is provided at least in the predetermined region S without casting of an insulating and non-magnetic casting material, just to protect the overall conductor arrangement of the current detection apparatus in accordance with the above-described embodiments, it is then possible if required to easily replace the carrier portion 4 with the associated sensor elements 3 as it is only necessary to fit the corresponding carrier portion 4 into the intermediate space 2, align the sensor elements 3 with respect to the two field regions 8 and 9 and suitably fix the assembly.

If in comparison casting by means of a suitable filling casting material in the interior of a housing fitted around the overall arrangement (at least in the predetermined region S) is preferred, then the arrangement of the carrier portion 4, after suitable orientation, can be permanently fixed with that orientation in the intermediate space 2 by the casting operation. Unwanted displacement of the carrier portion 4, in which case the associated sensor elements 3 are not associated or are no longer exactly associated with the preferred field regions 8 and 9 is thereby avoided. The arrangement of the sensor elements 3 on the carrier portion 4 also provides that the sensor elements 3 can be more easily oriented and secured in place.

For all of the above-described embodiments it is possible with the current detection apparatus according to the invention to link the advantages of a very close position of the individual sensor elements to the conductor in a region of a strong magnetic field for the measurement of very small currents, to the advantage of a simple arrangement and facilitated handling. Facilitated handling is substantially promoted by the arrangement of at least one sensor element 3 or a plurality of sensor elements 3 on the common carrier portion 4 and preferably also on a common substrate (chip).

The sensor elements are disposed in a region of the strong magnetic field (field regions 8 and 9) so that there is no need for further measures and components or elements for amplifying the magnetic field such as for example ferrous metals or ferrites. The current detection apparatus according to the invention affords less expensive arrangements which are of smaller dimensions, with at the same time a high level of measurement sensitivity. By means of differential processing of the output signals of the respective sensor elements 3, with a paired arrangement thereof, interference phenomena acting similarly on the sensor elements 3 can be easily eliminated or restricted in their effects. That improves measurement accuracy and sensitivity.

The current detection apparatus according to the invention can be used in relation to any kind of power supply devices and associated current bars or current conductors. That involves in particular the above-described use in motor vehicles in regard to the power supply (charging) of batteries in the motor vehicle. That can be important in particular for hybrid vehicles which have a high-power battery, and electric vehicles. The state of charge of the respective batteries can be reliably and continuously determined by way of the detection of the charging currents and the discharging currents as well as the terminal voltage and the battery temperature.

The present invention was described hereinbefore by means of embodiments by way of example in relation to the associated Figures. It will be self-evident however to the man skilled and active in this art that the configuration of the present invention in accordance with the above-described Figures and the references used for the respective constituent parts and components in the Figures and the description as well as the details given by way of example are not to be restrictively interpreted. The proportions set out in the individual Figures are also only by way of example and are only diagrammatically illustrated for improved understanding. The invention is not limited to the shapes and proportions specified. Rather all embodiments and variants which are embraced by the accompanying claims are viewed as belonging to the invention.

What is claimed is:

1. A current detection apparatus for detection of a current flowing through a conductor (1) by detection of a magnetic field surrounding the conductor, comprising:
    at least one sensor element (3) provided on a carrier portion (4) for detection of the magnetic field, and
    a predetermined region (S) of the conductor (1), at which the at least one sensor element is arranged, wherein
    the conductor (1) in the predetermined region (S) has a plurality of conductor portions (11, 12; La, Lb) which have the current to be measured flowing therethrough in the same direction and which are spaced from each other by a predetermined spacing and which form an intermediate space (2), and
    the carrier portion (4) is fitted into the intermediate space in such a way that the at least one sensor element (3) is arranged outside the intermediate space in adjacent relationship therewith in the magnetic field of the conductor (1),
    wherein the plurality of conductor portions (11, 12; La, Lb) in the predetermined region (S) have two U-shaped formations having three substantially parallel conductor portion parts (5, 6, 7) with a central common conductor portion part (6) by which at least two field regions (8, 9) are formed between the conductor portion parts, the conductor portion parts having open sides which are respectively oriented in opposite directions along a longitudinal extent (R) of the conductor (1).

2. The apparatus according to claim 1, wherein a plurality of mutually spaced sensor elements (3) is arranged on the carrier portion (4) and in an inserted position of the carrier portion in the intermediate space (2) at least one respective sensor element (3) is arranged with respect to the intermediate space on different sides of the multi-part conductor (1, 11, 12).

3. The apparatus according to claim 2, wherein the plurality of sensor elements (3) are arranged on a common substrate.

4. The apparatus according to claim 1, wherein a sum of each cross-sectional area of the plurality of conductor portions (11, 12) corresponds to a cross-sectional area of the conductor (1).

5. The apparatus according to claim 1, wherein a sum of currents (I1, I2) in the conductor portions (11, 12; La, Lb) is equal to the current (Ig) to be detected.

6. The apparatus according to claim 1, wherein the intermediate space (2) extends over all conductor portion parts (5, 6, 7) of the plurality of conductor portions (11, 12) within the predetermined region (S).

7. The apparatus according to claim 1, wherein the intermediate space (2) extends over all conductor portion parts (5, 6, 7) of the plurality of conductor portions with a predetermined height (d) uniformly within the predetermined region (S).

8. The apparatus according to claim 1, wherein the carrier portion (4) is arranged in the intermediate space (2) in such a way that the at least one sensor element (3) is arranged in one of the at least two field regions (8, 9) between the conductor portion parts (5, 6, 7).

9. The apparatus according to claim 1, wherein the carrier portion (4) is fitted into the intermediate space (2) in such a way that at least one sensor element (3) is arranged in each of the at least two field regions (8, 9) between the conductor portion parts (5, 6, 7).

10. The apparatus according to claim 9, wherein the plurality of sensor elements (3) are arranged on a common substrate.

11. The apparatus according to claim 1, wherein the carrier portion (4) at least partially fills the predetermined intermediate space (2) in the predetermined region (S).

12. The apparatus according to claim 1, wherein a magnetic field present in each of the respective at least two field regions (8, 9) is formed by the currents (I1, I2) in the conductor portion parts (5 and 6, 6 and 7) respectively adjacent to the field regions in question.

13. The apparatus according to claim 1, wherein the cross-sectional area of each of the conductor portion parts (5, 6, 7) is substantially equal.

14. The apparatus according to claim 1, wherein the plurality of sensor elements (3) are arranged on the carrier portion (4) at predetermined locations and the carrier portion is fitted into the intermediate space (2) in such a way that a longitudinal edge of the carrier portion forms a predetermined angle with a longitudinal direction (R) of the conductor (1) and at least one sensor element (3) is arranged in each field region (8, 9).

15. The apparatus according to claim 1, wherein the plurality of conductor portions (11, 12) are formed by individual conductors (La, Lb) and a totality of the individual conductors forms the conductor (1).

16. The apparatus according to claim 1, wherein there are provided at least two sensor elements (3), and after insertion of the carrier portion (4) into the intermediate space (2) at least one sensor element is arranged in each of the field regions (8, 9).

17. The apparatus according to claim 16, wherein the plurality of sensor elements (3) are arranged on a common substrate.

18. The apparatus according to claim 1, wherein the plurality of conductor portions (11, 12) are formed by individual conductors (La, Lb) fitted into a common holding element (13) and wherein the intermediate space (2) at least partially extends into the common holding element.

19. The apparatus according to claim 1, wherein the conductor (1) in the predetermined region (S) is enclosed by a housing and the interior of the housing is filled with an insulating material.

* * * * *